(12) United States Patent
Ishimoto et al.

(10) Patent No.: US 9,240,760 B2
(45) Date of Patent: Jan. 19, 2016

(54) POWER AMPLIFIER MODULE

(71) Applicant: Murata Manufacturing Co., Ltd., Kyoto (JP)

(72) Inventors: Kazuhiko Ishimoto, Kyoto (JP); Takashi Soga, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/540,141

(22) Filed: Nov. 13, 2014

(65) Prior Publication Data

US 2015/0070092 A1 Mar. 12, 2015

Related U.S. Application Data

(63) Continuation of application No. PCT/JP2014/067901, filed on Jul. 4, 2014.

(30) Foreign Application Priority Data

Jul. 5, 2013 (JP) .................................. 2013-142069

(51) Int. Cl.
*H03G 3/10* (2006.01)
*H03F 3/193* (2006.01)
*H03F 1/52* (2006.01)
*H03F 3/21* (2006.01)
(Continued)

(52) U.S. Cl.
CPC ................ *H03F 1/523* (2013.01); *H03F 3/193* (2013.01); *H03F 3/195* (2013.01); *H03F 3/211* (2013.01); *H03F 3/245* (2013.01); *H03F 2200/426* (2013.01); *H03F 2200/451* (2013.01); *H03F 2200/462* (2013.01)

(58) Field of Classification Search
USPC .................................. 330/285, 296, 289, 298
See application file for complete search history.

(56) References Cited

U.S. PATENT DOCUMENTS

| 7,075,373 | B2 * | 7/2006 | Briskin et al. | 330/298 |
| 7,193,474 | B2 | 3/2007 | Phillips | |
| 8,890,617 | B2 * | 11/2014 | Marra et al. | 330/285 |

(Continued)

FOREIGN PATENT DOCUMENTS

| JP | 2001-345693 A | 12/2001 |
| JP | 2002-009558 A | 1/2002 |
| JP | 2004-056727 A | 2/2004 |
| JP | 2008-004987 A | 1/2008 |

(Continued)

OTHER PUBLICATIONS

Office Action issued in corresponding Japanese Patent Application No. 2014-547601 dated Jun. 2, 2015.

(Continued)

*Primary Examiner* — Hieu Nguyen
(74) *Attorney, Agent, or Firm* — Pearne & Gordon LLP

(57) ABSTRACT

A power amplifier module includes a first amplification transistor that amplifies and outputs a radio frequency signal, a second amplification transistor that is connected in parallel to the first amplification transistor and that has a smaller size than the first amplification transistor, a bias circuit that supplies a bias voltage or a bias current to the first and second amplification transistors, a current detector circuit that detects a current flowing in the second amplification transistor, and a bias control circuit that controls the bias voltage or the bias current supplied from the bias circuit to the first and second amplification transistors depending on the detection result of the current detector circuit.

18 Claims, 11 Drawing Sheets

(51) Int. Cl.
*H03F 3/195* (2006.01)
*H03F 3/24* (2006.01)

(56) References Cited

U.S. PATENT DOCUMENTS

2001/0048319 A1 12/2001 Miyazaki
2001/0054933 A1 12/2001 Miyazawa
2003/0011435 A1 1/2003 Mori
2004/0017252 A1 1/2004 Miyazaki
2008/0211585 A1 9/2008 Karoui

FOREIGN PATENT DOCUMENTS

JP 2008-537414 A 9/2008
WO 02/056461 A1 7/2002
WO 2006/049800 A2 5/2006

OTHER PUBLICATIONS

International Search Report issued in Application No. PCT/JP2014/067901 dated Sep. 16, 2014.
Written Opinion issued in Application No. PCT/JP2014/067901 dated Sep. 16, 2014.

* cited by examiner

POWER AMPLIFIER MODULE

BACKGROUND OF THE INVENTION

1. Field of the Invention

The present invention relates to a power amplifier module.

2. Background Art

Mobile communication apparatuses such as mobile phones are equipped with a transmission unit that transmits a radio frequency (RF) signal to a base station. The transmission unit employs a power amplifier circuit that amplifies power of an RF signal to be transmitted to a base station. In such a transmission unit, for example, when impedance of a load such as an antenna varies, a large current may flow in the power amplifier circuit. Accordingly, in the transmission unit, a current flowing in the power amplifier circuit is limited so as to prevent the power amplifier circuit from being destroyed due to the large current.

For example, a transmission unit disclosed in Patent Document 1 includes a regulator circuit that supplies power to a power amplifier circuit, and a current limit circuit that limits the current flowing in the power amplifier circuit, in addition to the power amplifier circuit.

[Patent Document 1] WO2006/049800

SUMMARY OF THE INVENTION

In the transmission unit disclosed in Patent Document 1, the current (ICC) supplied from the regulator circuit to the power amplifier circuit, that is, the current flowing in the power amplifier circuit, is detected by the current limit circuit. Specifically, the current limit circuit includes a transistor (detection transistor) connected to a transistor included in the regulator circuit in a current-mirror manner. When the current flowing in the detection transistor is greater than a predetermined level, the current limit circuit limits the current supplied to the power amplifier circuit by controlling the regulator circuit.

In this way, by causing the current limit circuit to monitor the current supplied from the regulator circuit to the power amplifier circuit, it is possible to prevent a large current from flowing in the power amplifier circuit, where the current limit circuit is based on the configuration of the regulator.

The present invention is made in consideration of the above-mentioned circumstances and an object thereof is to limit a current flowing in a power amplifier circuit without using a configuration for supplying power to the power amplifier circuit.

According to an aspect of the present invention, there is provided a power amplifier module including: a first amplification transistor that amplifies and outputs a radio frequency signal; a second amplification transistor that is connected in parallel to the first amplification transistor and that has a smaller size than the first amplification transistor; a bias circuit that supplies a bias voltage or a bias current to the first and second amplification transistors; a current detector circuit that detects a current flowing in the second amplification transistor; and a bias control circuit that controls the bias voltage or the bias current supplied from the bias circuit to the first and second amplification transistors depending on the detection result of the current detector circuit.

According to the present invention, it is possible to limit a current flowing in a power amplifier circuit without using a configuration for supplying power to the power amplifier circuit.

DESCRIPTION OF THE PREFERRED EMBODIMENTS

Figure 1:
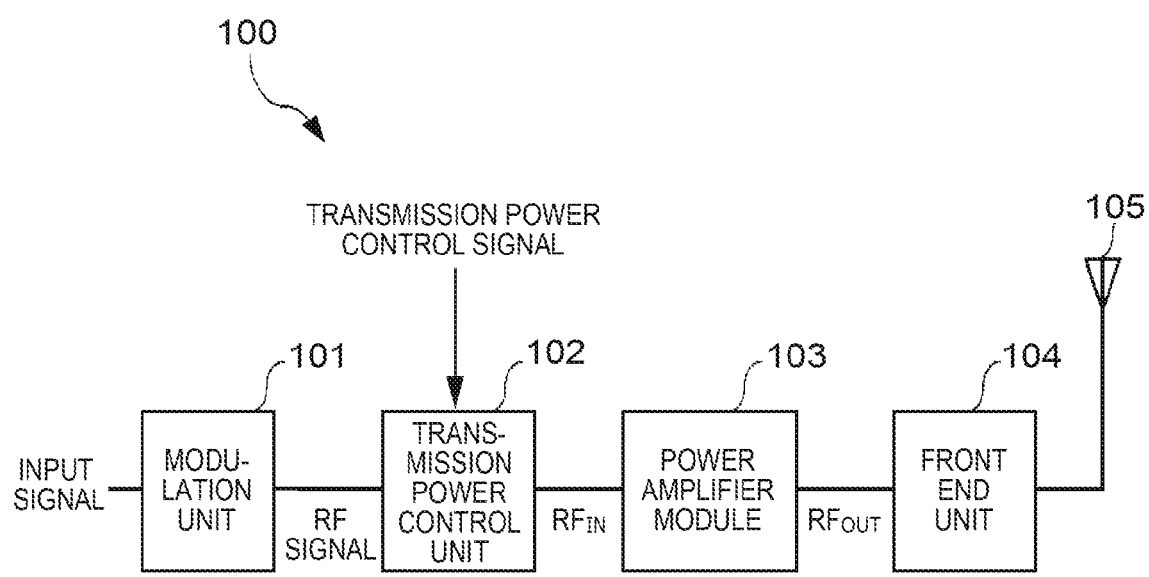
FIG. 1 is a diagram illustrating an example of a configuration of a transmission unit including a power amplifier module according to an embodiment of the present invention.

Hereinafter, an embodiment of the present invention will be described with reference to the accompanying drawings. FIG. 1 is a diagram illustrating an example of a configuration of a transmission unit including a power amplifier module according to an embodiment of the present invention. The transmission unit 100 is used in a mobile communication apparatus such as a mobile phone so as to transmit various signals of voice, data, and the like to a base station. The mobile communication apparatus also includes a reception unit that receives a signal from the base station, but the reception unit will not be described herein.

As illustrated in FIG. 1, the transmission unit 100 includes a modulation unit 101, a transmission power control unit 102, a power amplifier module 103, a front end unit 104, and an antenna 105.

The modulation unit 101 modulates an input signal on the basis of a modulation method such as a high speed uplink packet access (HSUPA) method or a long-term evolution (LTE) method and generates a radio frequency (RF) signal to be wirelessly transmitted. For example, the frequency of the RF signal ranges from several hundreds of MHz to several GHz.

The transmission power control unit 102 adjusts and outputs power of an RF signal on the basis of a transmission power control signal. The transmission power control signal is generated, for example, on the basis of an adaptive power control (APC) signal transmitted from a base station. For example, the base station can transmit the APC signal as a command for adjusting transmission power in a mobile communication apparatus to an appropriate level to the mobile communication apparatus by measuring a signal received from the mobile communication apparatus.

The power amplifier module 103 amplifies the power of the RF signal ($RF_{IN}$) output from the transmission power control unit 102 to a level appropriate for transmission to the base station and outputs an amplified signal ($RF_{OUT}$).

The front end unit 104 performs filtering of the amplified signal, switching of the reception signal received from the base station, and the like. The amplified signal output from the front end unit 104 is transmitted to the base station via the antenna 105.

Figure 2:
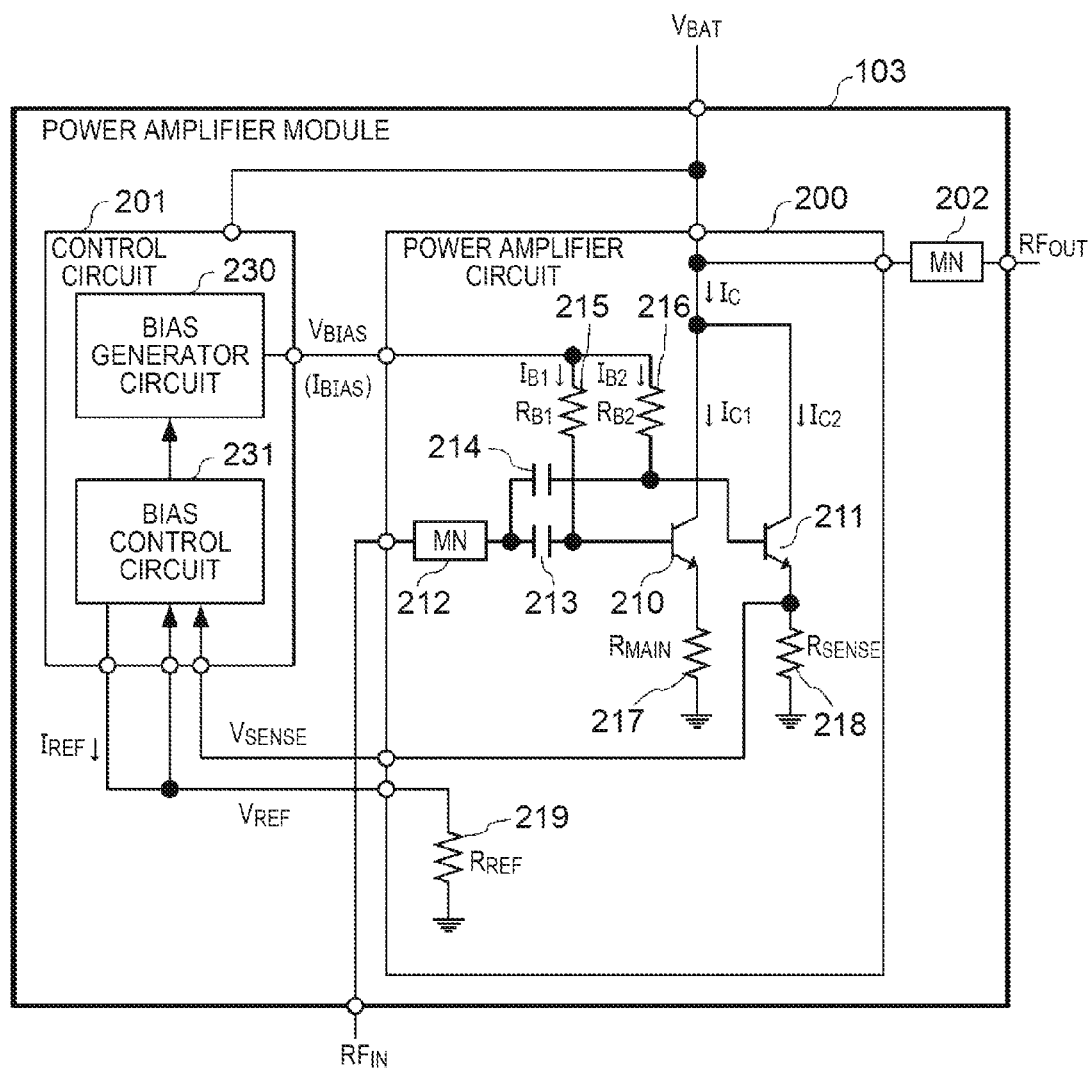
FIG. 2 is a diagram illustrating a first example first embodiment of a configuration of the power amplifier module.

FIG. 2 is a diagram illustrating a power amplifier module 103A (first embodiment) which is an example of the power amplifier module 103. As illustrated in FIG. 2, the power amplifier module 103A includes a power amplifier circuit 200, a control circuit 201, and a matching network (MN) 202. In the configuration illustrated in FIG. 2, the power amplifier circuit 200 and the control circuit 201 are formed on different boards. For example, the power amplifier circuit 200 may be constructed using bipolar transistors such as hetero-junction bipolar transistors (HBTs). When the HBTs are used in the power amplifier circuit 200, examples of the material of the substrate of the HBTs include SiGe, GaAs, InP, and GaN. For example, the control circuit 201 may be constructed using metal-oxide-silicon field-effect transistors (MOSFETs). The power amplifier circuit 200 and the control circuit 201 may be formed on the same board.

The power amplifier circuit 200 amplifies the power of an input RF signal ($RF_{IN}$) and outputs an amplified signal ($RF_{OUT}$) via the matching network 202. As illustrated in FIG. 2, the power amplifier circuit 200 includes an NPN transistor 210 (first amplification transistor), an NPN transistor 211 (second amplification transistor), a matching network 212, a capacitor 213 (first capacitor), a capacitor 214 (second capacitor), and resistors 215 to 219.

The NPN transistors 210 and 211 are current amplifying elements (amplification transistors) that amplify and output a current input to the base thereof. As illustrated in FIG. 2, the NPN transistors 210 and 211 are connected in parallel to each other. The NPN transistor 211 is provided to detect a current $I_C$ flowing in the power amplifier circuit 200 and has a size smaller than the NPN transistor 210. Specifically, for example, the NPN transistor 210 may be a transistor having a multi-finger structure in which the number of fingers is "N", each finger having the same emitter size and being connected in parallel. For example, the NPN transistor 211 may be a transistor in which the number of fingers is "1" and which is constructed using a single transistor having an emitter size equal to that of the fingers of the NPN transistor 210.

In this embodiment, the number of fingers of the NPN transistor 211 is described to be "1", but the number of fingers of the NPN transistor 211 does not need to be "1" as long as it is smaller than the number of fingers "N" of the NPN transistor 210. In this embodiment, the difference in size between the NPN transistors 210 and 211 is based on the difference in the number of fingers, but may be based on the difference in emitter size instead of the number of fingers.

The matching network 212 is provided to match impedance of the input of the NPN transistors 210 and 211 with the RF signal ($RF_{IN}$) output from the transmission power control unit 102 and is constructed, for example, using a capacitor or an inductor.

The capacitors 213 and 214 are coupling capacitors for inputting the RF signal ($RF_{IN}$). One end of the capacitor 213 is connected to the matching network 212 and the other end thereof is connected to the base of the NPN transistor 210. One end of the capacitor 214 is connected to the matching network 212 and the other end thereof is connected to the base of the NPN transistor 211. The capacitance ratio of the capacitors 213 and 214 is determined depending on the size ratio (N:1) of the NPN transistors 210 and 211. In this way, by setting the capacitance ratio of the capacitors 213 and 214 to N:1, the RF signal ($RF_{IN}$) output from the matching network 212 is divided at N:1 and the divided signals are input to the NPN transistors 210 and 211.

The resistor 215 ($R_{B1}$) and the resistor 216 ($R_{B2}$) constitute a bias adjusting circuit that adjusts bias currents $I_{B1}$ and $I_{B2}$ supplied to the bases of the NPN transistors 210 and 211 on the basis of a bias voltage $V_{BIAS}$ (or a bias current $I_{BIAS}$) supplied from the control circuit 201. The resistance values of the resistors 215 and 216 are set so that the current densities of the NPN transistors 210 and 211 are equal to each other. That is, when the size ratio of the NPN transistors 210 and 211 is N:1, the resistance values of the resistors 215 and 216 are set so that the bias currents $I_{B1}$ and $I_{B2}$ are N:1. An example of the method of setting the resistance values of the resistors 215 and 216 will be described later.

A resistor 217 ($R_{MAIN}$) is disposed between the emitter of the NPN transistor 210 and the ground. Similarly, a resistor 218 ($R_{SENSE}$) is disposed between the emitter of the NPN transistor 211 and the ground. Since the NPN transistors 210 and 211 are connected in parallel to each other, the current $I_C$ flowing in the power amplifier circuit 200 is divided into currents $I_{C1}$ and $I_{C2}$ and the divided currents flow in the NPN transistors 210 and 211. As described above, since the bias currents $I_{B1}$ and $I_{B2}$ are adjusted so that the current densities of the NPN transistors 210 and 211 are equal to each other, the currents $I_{C1}$ and $I_{C2}$ have current values corresponding to the size ratio (N:1) of the NPN transistors 210 and 211. The resistor 218 is a resistor (detection resistor) disposed to detect the current value of the current $I_{C2}$. Specifically, the resistor 218 is a current-voltage conversion circuit (current detector circuit) that converts the current $I_{C2}$ into a detection voltage $V_{SENSE}$. The resistance value of the resistor 218 can be set to, for example, several ohms. On the other hand, the resistance value of the resistor 217 can be set to, for example, a small value of about several milliohms so as to reduce power loss due to a large current $I_{C1}$.

A resistor 219 ($R_{REF}$) is a resistor (reference voltage generator circuit, reference resistor) that generates a reference voltage $V_{REF}$ on the basis of a constant current $I_{REF}$ supplied from the control circuit 201. The reference voltage $V_{REF}$ is output to the control circuit 201 for comparison with the detection voltage $V_{SENSE}$. In the configuration illustrated in FIG. 2, the resistors 218 and 219 are formed on the same chip and can cancel the unevenness in resistance value due to the processes of the resistors 218 and 219. That is, it is possible to improve comparison accuracy of the detection voltage $V_{SENSE}$ and the reference voltage $V_{REF}$. The reference voltage $V_{REF}$ may be generated outside the power amplifier circuit 200.

An example of the method of setting the resistance values of the resistors 215 and 216 will be described below. The resistance values of the resistors 215 to 218 are defined as $R_{B1}$, $R_{B2}$, $R_{MAIN}$, and $R_{SENSE}$. The current amplification rates of the NPN transistors 210 and 211 are defined as hFE, and the base-emitter voltage thereof is defined as $V_{BE}$. The size ratio of the NPN transistors 210 and 211 is set to N:1. Since the voltages applied to ends on one side of the resistors 215 and 216 are common (for example, $V_{BIAS}$), the relationship expressed by Expression (1) is established.

$$I_{B1} \times R_{B1} + V_{BE} + I_{B1} \times hFE \times R_{MAIN} = I_{B2} \times R_{B2} + V_{BE} + I_{B2} \times hFE \times R_{SENSE} \quad (1)$$

Since $I_{B1}=N\times I_{B2}$, the relationship expressed by Expression (2) is established from Expression (1).

$$R_{B2}=N\times R_{B1}-hFE\times(R_{SENSE}-R_{MAIN}) \quad (2)$$

Accordingly, by setting the resistance values of the resistors 215 and 216 so as to satisfy the relationship of Expression (2), the bias currents $I_{B1}$ and $I_{B2}$ can be made to be based on the size ratio of the NPN transistors 210 and 211 and thus the current densities of the NPN transistors 210 and 211 can be made to be equal to each other.

The control circuit 201 is a circuit that controls the bias voltages or the bias currents supplied to the NPN transistors 210 and 211, and includes a bias generator circuit 230 and the bias control circuit 231.

The bias generator circuit 230 outputs the bias voltage $V_{BIAS}$ (or the bias current $I_{BIAS}$) of a level based on the control of the bias control circuit 231. A bias circuit that supplies the bias voltage or the bias current to the NPN transistors 210 and 211 is constructed using the bias generator circuit 230 and the resistors 215 and 216.

The bias control circuit 231 controls the bias generator circuit 230 so as to decrease the bias voltage $V_{BIAS}$ (or the bias current $I_{BIAS}$) to limit the current $I_C$ on the basis of the detection voltage $V_{SENSE}$ and the reference voltage $V_{REF}$ when the current $I_C$ flowing in the power amplifier circuit 200 is equal to or greater than a predetermined level. The bias control circuit 231 outputs the reference current $I_{REF}$ for generating the reference voltage $V_{REF}$ in the power amplifier circuit 200.

Figure 3:
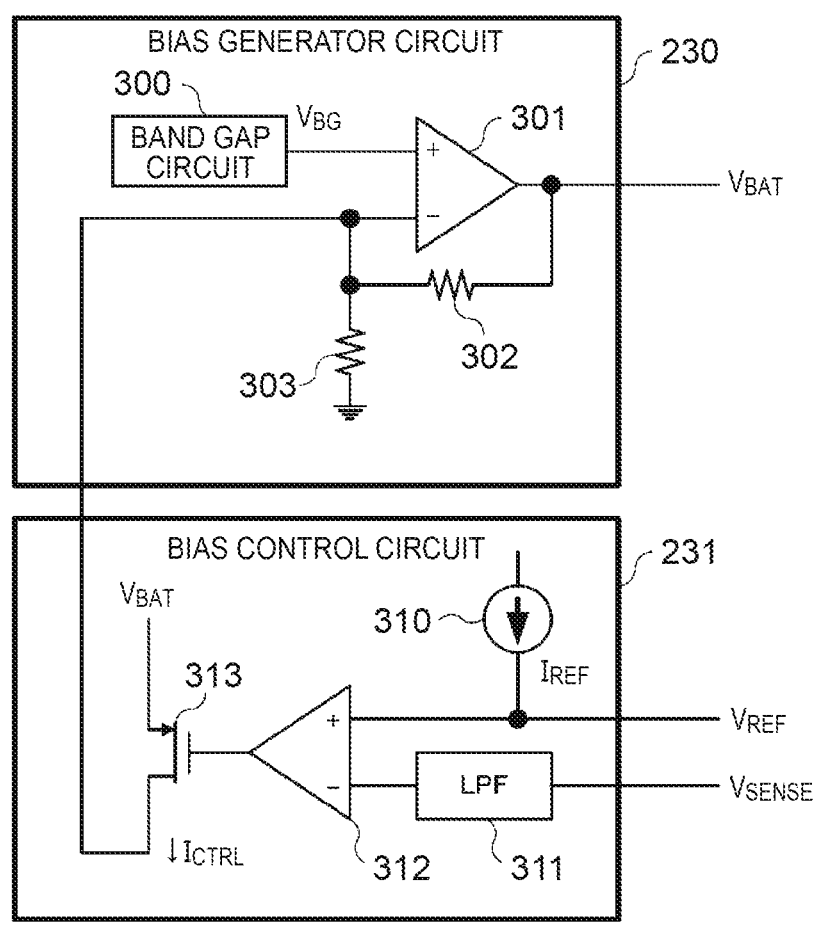
FIG. 3 is a diagram illustrating an example of a configuration of a bias generator circuit and a bias control circuit.

FIG. 3 is a diagram illustrating an example of the configurations of the bias generator circuit 230 and the bias control circuit 231.

The bias generator circuit 230 includes a band gap circuit 300, an operational amplifier 301, a resistor 302 (first resistor), and a resistor 303 (second resistor).

The band gap circuit 300 generates a band-gap reference voltage $V_{BG}$, which does not depend on a variation in temperature or source voltage, from a source voltage such as a battery voltage $V_{BAT}$. The band-gap reference voltage $V_{BG}$ is, for example, about 1.2 V.

The operational amplifier 301 and the resistors 302 and 303 constitute a non-inverting amplifier circuit, which amplifies the band-gap reference voltage $V_{BG}$ with a gain corresponding to the resistance values of the resistors 302 and 303 to generate the bias voltage $V_{BIAS}$.

The bias control circuit 231 includes a constant current circuit 310 (reference current generator circuit), a low-pass filter (LPF) 311, a comparator 312 (comparator circuit), and a P-channel MOSFET 313.

The non-inverted input terminal of the comparator 312 is supplied with the reference voltage $V_{REF}$ generated using the constant current $I_{REF}$ from the constant current circuit 310. The inverted input terminal of the comparator 312 is supplied with the detection voltage $V_{SENSE}$ based on the current $I_C$ of the power amplifier circuit 200 via the LPF 311. The LPF 311 is used to smooth the detection voltage $V_{SENSE}$ oscillating depending on the RF signal ($RF_{IN}$). The output terminal of the comparator 312 is connected to the gate of the P-channel MOSFET 313. The drain of the P-channel MOSFET 313 is connected to the inverted input terminal of the operational amplifier 301.

In the bias control circuit 231 having the above-mentioned configuration, when the detection voltage $V_{SENSE}$ is higher than the reference voltage $V_{REF}$, the output of the comparator 312 is at a low level. When the output of the comparator 312 is at the low level, the P-channel MOSFET 313 is turned on and a control current $I_{CTRL}$ flows from the P-channel MOSFET 313 to the inverted input terminal of the operational amplifier 301. The operational amplifier 301 operates so that the non-inverted input terminal and the inverted input terminal thereof have the same potential. Accordingly, when the control current $I_{CTRL}$ flows therein, the bias voltage $V_{BIAS}$ decreases. With the decrease in the bias voltage $V_{BIAS}$, the bias currents $I_{B1}$ and $I_{B2}$ supplied to the NPN transistors 210 and 211 decrease and thus the current $I_C$ flowing in the power amplifier circuit 200 is limited.

In this way, the P-channel MOSFET 313 constitutes a bias-reducing circuit (current circuit) that reduces the bias voltage or the bias current to the NPN transistors 210 and 211 on the basis of the comparison result of the comparator 312 when the detection voltage $V_{SENSE}$ is higher than the reference voltage $V_{REF}$.

In the power amplifier module 103A having the above-mentioned configuration, the NPN transistor 211 having a smaller size than the NPN transistor 210 as a main current amplification element is disposed in the power amplifier circuit 200. By detecting the current $I_{C2}$ flowing in the NPN transistor 211, the current $I_C$ flowing in the power amplifier circuit 200 is limited. Accordingly, it is possible to limit the current $I_C$ flowing in the power amplifier circuit 200 without using a configuration for supplying power to the power amplifier circuit 200. Since the current $I_C$ flowing in the power amplifier circuit 200 is detected using the current $I_{C2}$ flowing in the NPN transistor 211 having a smaller size than the NPN transistor 210, it is possible to reduce power loss at the time of detecting a current.

In the power amplifier module 103A illustrated in FIG. 2, the power amplifier circuit has a one-stage configuration, but the power amplifier circuit may have a multi-stage configuration. When the power amplifier circuit has a multi-stage configuration, it is preferable that the power amplifier circuit in the final stage have the same configuration as the power amplifier circuit 200 illustrated in FIG. 2.

Figure 4:
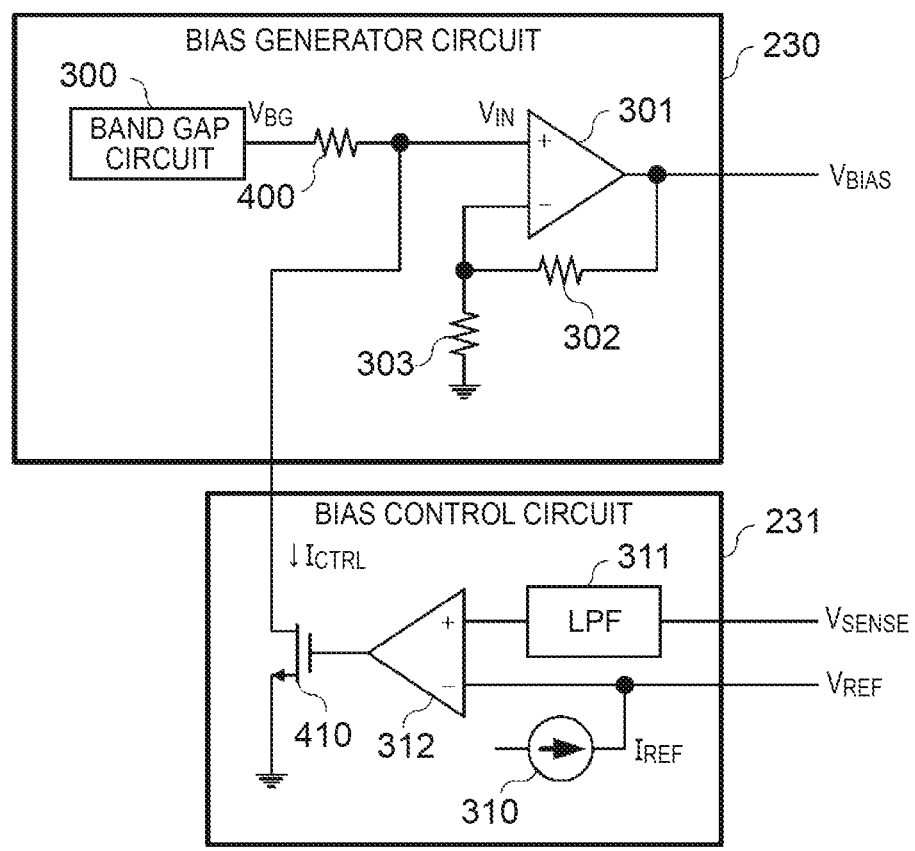
FIG. 4 is a diagram illustrating another example of a configuration of the bias generator circuit and the bias control circuit.

FIG. 4 is a diagram illustrating another example of the configurations of the bias generator circuit 230 and the bias control circuit 231. The same elements as illustrated in FIG. 3 will be referenced by the same reference numerals and description thereof will not be repeated.

The bias generator circuit 230 includes a resistor 400 (third resistor) in addition to the configuration illustrated in FIG. 3. One end of the resistor 400 is supplied with the band-gap reference voltage $V_{BG}$ and the other end of the resistor 400 is connected to the non-inverted input terminal of the operational amplifier 301.

The bias control circuit 231 includes an N-channel MOSFET 410 instead of the P-channel MOSFET 313 in the configuration illustrated in FIG. 3. The non-inverted input terminal of the comparator 312 is supplied with the detection voltage $V_{SENSE}$ via the LPF 311. The inverted input terminal of the comparator 312 is supplied with the reference voltage $V_{REF}$ generated using the constant current $I_{REF}$ from the constant current circuit 310. The output terminal of the comparator 312 is connected to the gate of the N-channel MOSFET 410. The drain of the N-channel MOSFET 410 is connected to the non-inverted input terminal of the operational amplifier 301.

In the bias control circuit 231 having the above-mentioned configuration, when the detection voltage $V_{SENSE}$ is higher than the reference voltage $V_{REF}$, the output of the comparator 312 is at a high level. When the output of the comparator 312 is at the high level, the N-channel MOSFET 410 is turned on and the control current $I_{CTRL}$ is extracted to flow from the resistor 400 to the N-channel MOSFET 410. Accordingly, a voltage drop due to the resistor 400 occurs, the input voltage $V_{IN}$ supplied to the non-inverted input terminal of the operational amplifier 301 decreases, and thus the bias voltage $V_{BIAS}$ decreases. With the decrease in the bias voltage $V_{BIAS}$, the bias currents $I_{B1}$ and $I_{B2}$ supplied to the NPN transistors 210 and 211 decrease and thus the current $I_C$ flowing in the power amplifier circuit 200 is limited.

In this way, the N-channel MOSFET 410 constitutes a bias-reducing circuit (current circuit) that reduces the bias voltage or the bias current to the NPN transistors 210 and 211 on the basis of the comparison result of the comparator 312 when the detection voltage $V_{SENSE}$ is higher than the reference voltage $V_{REF}$.

Figure 5:
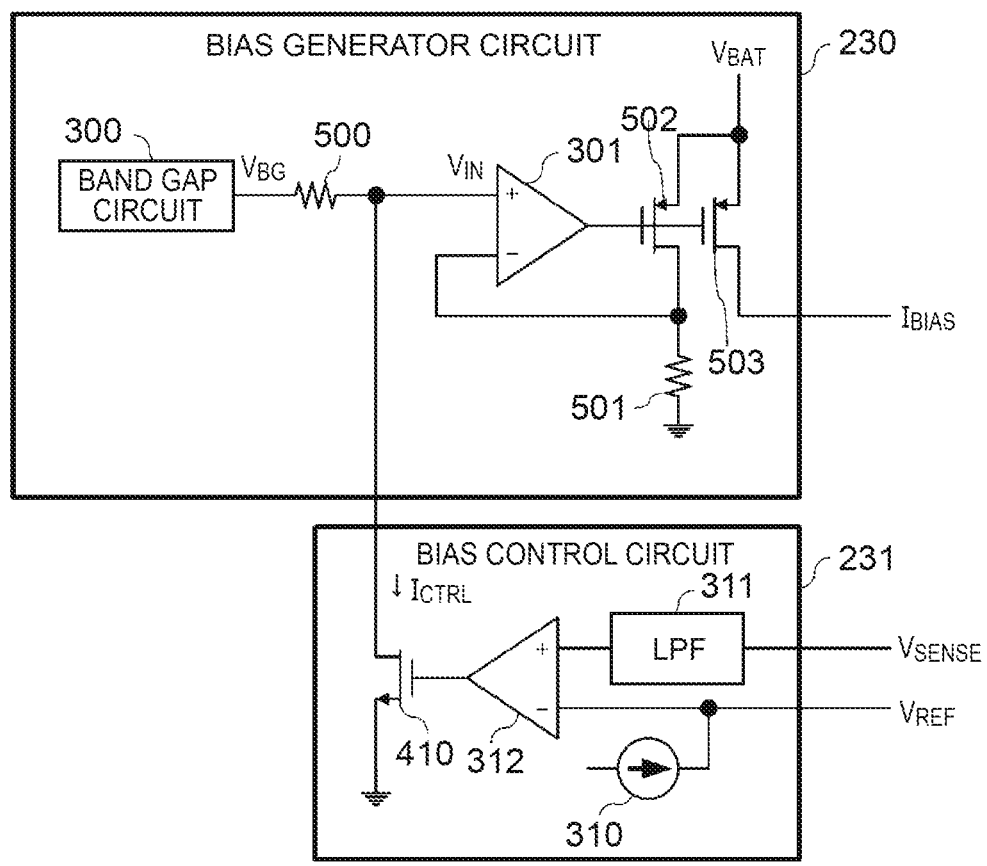
FIG. 5 is a diagram illustrating still another example of a configuration of the bias generator circuit and the bias control circuit.

FIG. 5 is a diagram illustrating still another example of the configurations of the bias generator circuit 230 and the bias control circuit 231. The same elements as illustrated in FIG. 3 or 4 will be referenced by the same reference numerals and description thereof will not be repeated.

The bias generator circuit 230 includes a resistor 500 (fourth resistor), a resistor 501, and P-channel MOSFETs 502 and 503 in addition to the band gap circuit 300 and the operational amplifier 301. One end of the resistor 500 is supplied with the band-gap reference voltage $V_{BG}$ and the other end of the resistor 500 is connected to the non-inverted input terminal of the operational amplifier 301. The drain of the P-channel MOSFET 502 is grounded via the resistor 501 and is also connected to the inverted input terminal of the operational amplifier 301. The P-channel MOSFET 503 is connected to the P-channel MOSFET 502 in a current mirror manner. The bias control circuit 231 has the same configuration as illustrated in FIG. 4.

In the bias generator circuit 230 having the above-mentioned configuration, the operational amplifier 301 operates so that the voltage of the drain of the P-channel MOSFET 502 is equal to the input voltage $V_{IN}$ supplied to the non-inverted input terminal. Accordingly, a current corresponding to the input voltage $V_{IN}$ flows in the P-channel MOSFET 502. Since the P-channel MOSFET 503 is connected to the P-channel MOSFET 502 in a current mirror manner, the bias current $I_{BIAS}$ output from the P-channel MOSFET 503 corresponds to the input voltage $V_{IN}$. In this way, the operational amplifier 301, the resistor 501, and the P-channel MOSFETs 502 and 503 constitute a current generator circuit that generates the bias current $I_{BIAS}$ corresponding to the input voltage $V_{IN}$.

In the bias control circuit 231, when the detection voltage $V_{SENSE}$ is higher than the reference voltage $V_{REF}$, the output of the comparator 312 is at a high level. When the output of the comparator 312 is at the high level, the N-channel MOSFET 410 is turned on and the control current $I_{CTRL}$ is extracted to flow from the resistor 500 to the N-channel MOSFET 410. Accordingly, a voltage drop due to the resistor 500 occurs and the input voltage $V_{IN}$ supplied to the non-inverted input terminal of the operational amplifier 301 decreases. Since the operational amplifier 301 operates so that the non-inverted input terminal and the inverted input terminal have the same potential, the bias current $I_{BIAS}$ also decreases with the decrease in the input voltage $V_{IN}$. With the decrease in the bias current $I_{BIAS}$, the bias currents $I_{B1}$ and $I_{B2}$ supplied to the NPN transistors 210 and 211 decrease and thus the current $I_C$ flowing in the power amplifier circuit 200 is limited.

In this way, the N-channel MOSFET 410 constitutes a bias-reducing circuit (current circuit) that reduces the bias voltage or the bias current to the NPN transistors 210 and 211 on the basis of the comparison result of the comparator 312 when the detection voltage $V_{SENSE}$ is higher than the reference voltage $V_{REF}$.

Figure 6:
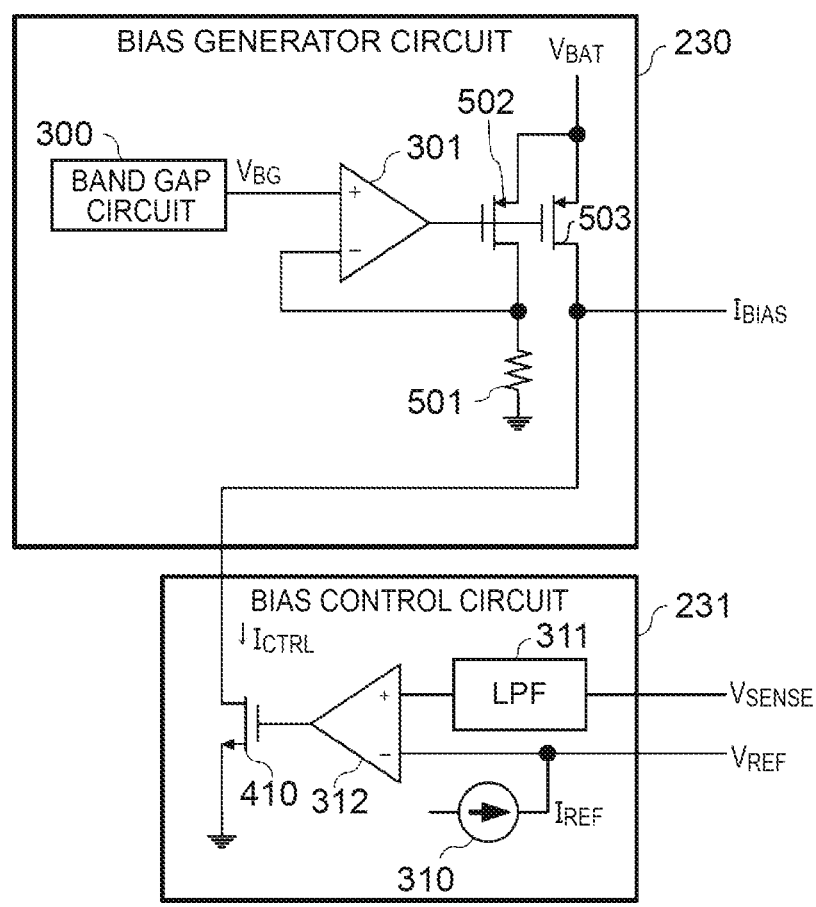
FIG. 6 is a diagram illustrating still another example of a configuration of the bias generator circuit and the bias control circuit.

FIG. 6 is a diagram illustrating still another example of the configurations of the bias generator circuit 230 and the bias control circuit 231. The same elements as illustrated in FIG. 5 will be referenced by the same reference numerals and description thereof will not be repeated.

The configuration illustrated in FIG. 6 is equal to the configuration illustrated in FIG. 5, except that the bias generator circuit 230 does not include the resistor 500 and the drain of the P-channel MOSFET 503 of the bias generator circuit 230 is connected to the drain of the N-channel MOSFET 410 of the bias control circuit 231.

In this configuration, when the detection voltage $V_{SENSE}$ is higher than the reference voltage $V_{REF}$, the output of the comparator 312 of the bias control circuit 231 is at a high level. When the output of the comparator 312 is at the high level, the N-channel MOSFET 410 is turned on and a part of the current output from the drain of the P-channel MOSFET 503 of the bias generator circuit 230 is extracted due to the control current $I_{CTRL}$. Accordingly, the bias current $I_{BIAS}$ output from the drain of the P-channel MOSFET 503 to the power amplifier circuit 200 decreases. With the decrease in the bias current $I_{BIAS}$, the bias currents $I_{B1}$ and $I_{B2}$ supplied to the NPN transistors 210 and 211 decrease and thus the current $I_C$ flowing in the power amplifier circuit 200 is limited.

In this way, the N-channel MOSFET 410 constitutes a bias-reducing circuit (current circuit) that reduces the bias voltage or the bias current to the NPN transistors 210 and 211 on the basis of the comparison result of the comparator 312 when the detection voltage $V_{SENSE}$ is higher than the reference voltage $V_{REF}$.

Hitherto, embodiments of the present invention have been described. According to these embodiments, by disposing the NPN transistor 211, which has a smaller size than the NPN transistor 210 as a main current amplification element, in the power amplifier circuit 200 and detecting the current $I_{C2}$ flowing in the NPN transistor 211, the current $I_C$ flowing in the power amplifier circuit 200 can be limited. Accordingly, it is possible to limit the current $I_C$ flowing in the power amplifier circuit 200 without using a configuration for supplying power to the power amplifier circuit 200. Since the current $I_C$ flowing in the power amplifier circuit 200 is detected using the current $I_{C2}$ flowing in the NPN transistor 211 having a smaller size than the NPN transistor 210, it is possible to reduce power loss at the time of detecting a current.

According to these embodiments, the bias currents $I_{B1}$ and $I_{B2}$ corresponding to the size ratio of the NPN transistors 210 and 211 are supplied to the NPN transistors 210 and 211. Accordingly, it is possible to make the current densities of the NPN transistors 210 and 211 equal to each other and to accurately control the current $I_C$ flowing in the power amplifier circuit 200.

According to these embodiments, an RF signal ($RF_{IN}$) is input to the NPN transistors 210 and 211 via the capacitors 213 and 214 having the capacitance values corresponding to the size ratio of the NPN transistors 210 and 211. Accordingly, it is possible to make the current densities of the NPN transistors 210 and 211 equal to each other and to accurately control the current $I_C$ flowing in the power amplifier circuit 200.

According to these embodiments, the detection resistor 218 for detecting the current flowing in the power amplifier circuit 200 and the reference resistor 219 for generating the reference voltage $V_{REF}$ are formed on the same chip. Accordingly, it is possible to cancel the unevenness in resistance value between detection resistor 218 and the reference resistor 219 and thus to accurately control the current $I_C$ flowing in the power amplifier circuit 200.

Figure 7:
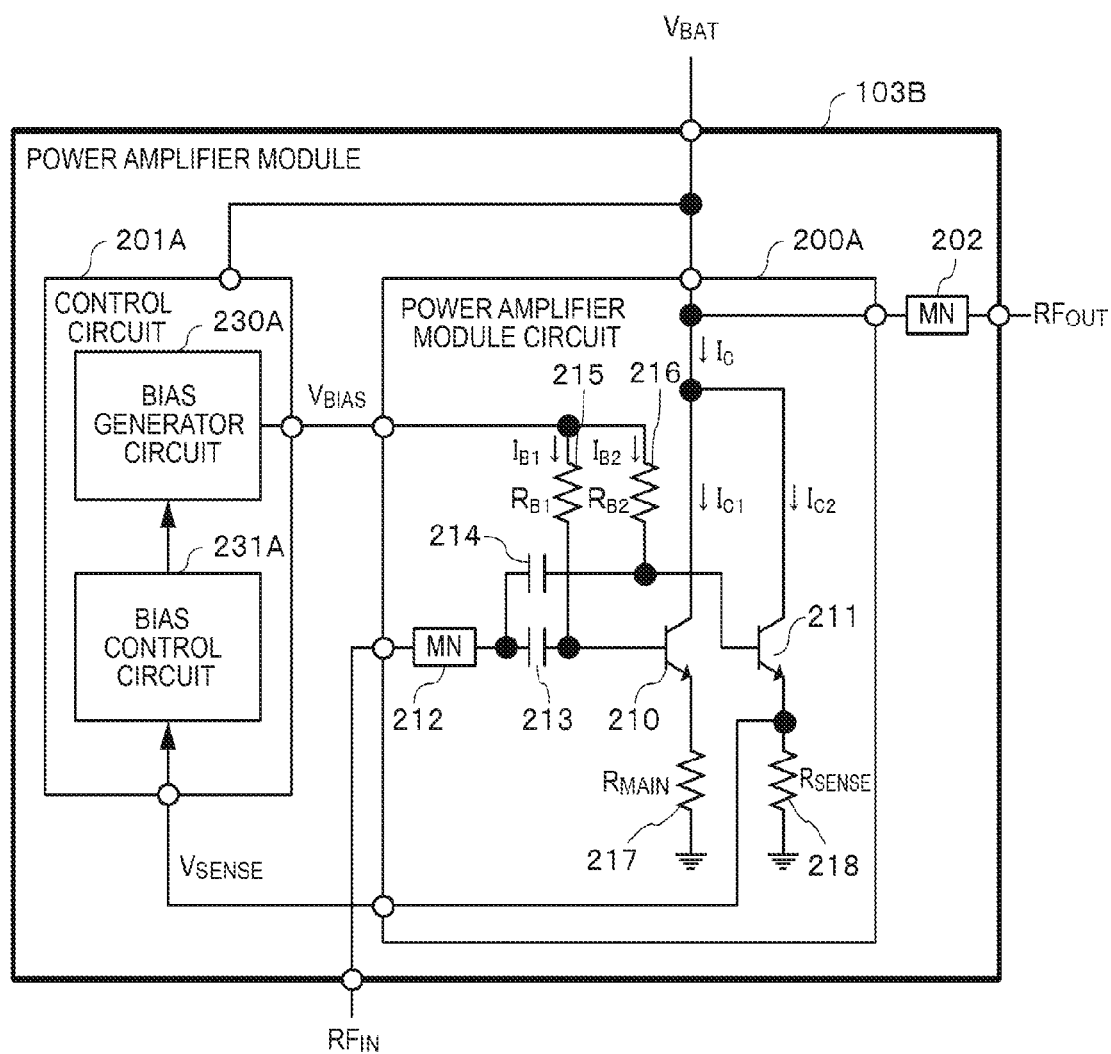
FIG. 7 is a diagram illustrating a second example embodiment of the configuration of the power amplifier module.

FIG. 7 is a diagram illustrating a power amplifier module 103B (second embodiment) which is another example of the power amplifier module 103. The same elements as that of the power amplifier module 103A illustrated in FIG. 2 will be referenced by the same reference numerals and description thereof will not be repeated.

As illustrated in FIG. 7, the power amplifier module 103B includes a power amplifier circuit 200A and a control circuit 201A instead of the power amplifier circuit 200 and the control circuit 201 of the power amplifier module 103A.

The power amplifier circuit 200A is the same as the power amplifier circuit 200 except that the power amplifier circuit 200A does not include the resistor 219 of the power amplifier circuit 200. However, the power amplifier circuit 200A may be configured to include the resistor 219.

The control circuit 201A includes a bias generator circuit 230A and a bias control circuit 231A instead of the bias generator circuit 230 and the bias control circuit 231 of the control circuit 201.

Figure 8:
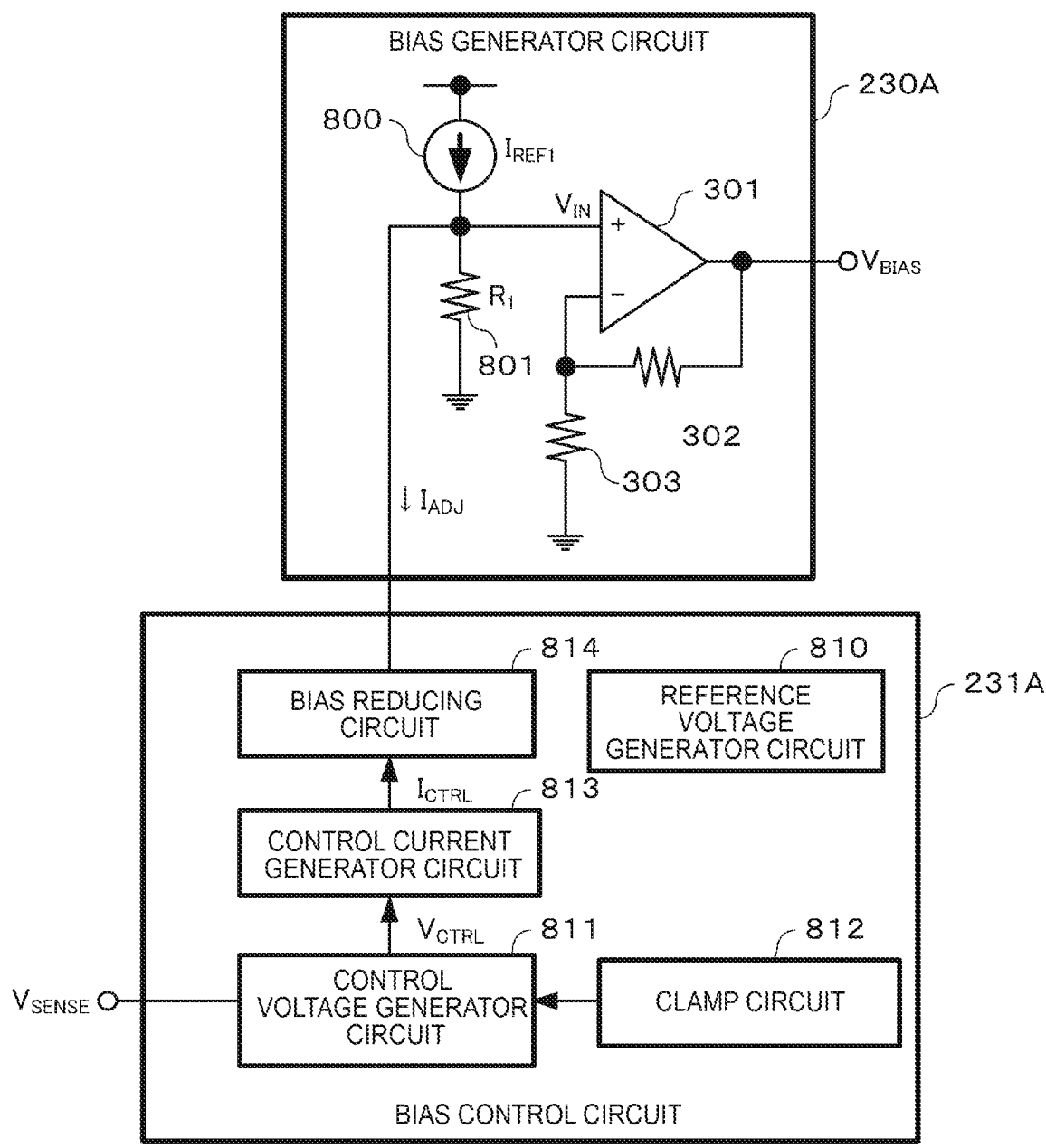
FIG. 8 is a diagram illustrating an example of a configuration of another bias generator circuit and another bias control circuit.

FIG. 8 is a diagram illustrating an example of a configuration of the bias generator circuit 230A and the bias control circuit 231A. The same elements as that of the bias generator circuit 230 illustrated in FIG. 3 will be referenced by the same reference numerals and description thereof will not be repeated.

The bias generator circuit 230A amplifies the input voltage $V_{IN}$ which is applied to the non-inverted input terminal of the operational amplifier 301 with a gain corresponding to the resistors 302 and 303 to generate the bias voltage $V_{BIAS}$. The constant current circuit 800 (first constant current circuit) is a circuit that generates the constant current $I_{REF1}$ (first constant current) and is connected to the resistor 801 (fifth resistor) in series. An adjustment current $I_{ADJ}$ controlled by the bias control circuit 231A is extracted from between the constant current circuit 800 and the resistor 801 to flow. Accordingly, when the resistance value of the resistor 801 is defined as $R_1$, the input voltage $V_{IN}$ applied to the non-inverted input terminal of the operational amplifier 301 is defined as $V_{IN}=(I_{REF1}-I_{ADJ})\times R_1$.

The bias control circuit 231A includes a reference voltage generator circuit 810, a control voltage generator circuit 811, a clamp circuit 812, a control current generator circuit 813, and a bias-reducing circuit 814.

The reference voltage generator circuit 810 generates a plurality of the reference voltages used in the bias control circuit 231A.

The control voltage generator circuit 811 generates a control voltage $V_{CTRL}$ corresponding to the detection voltage $V_{SENSE}$. The clamp circuit 812 clamps the control voltage $V_{CTRL}$ to be equal to or less than the predetermined level.

The control current generator circuit 813 generates the control current $I_{CTRL}$ corresponding to the control voltage $V_{CTRL}$ clamped by the clamp circuit 812.

The bias-reducing circuit 814 (second bias-reducing circuit) reduces the bias voltage $V_{BIAS}$ based on the control current $I_{CTRL}$. Specifically, the bias-reducing circuit 814 generates the adjustment current $I_{ADJ}$ corresponding to the control current $I_{CTRL}$. In the bias generator circuit 230A, the bias voltage $V_{BIAS}$ is reduced according to an amount of the adjustment current $I_{ADJ}$.

Figure 9:
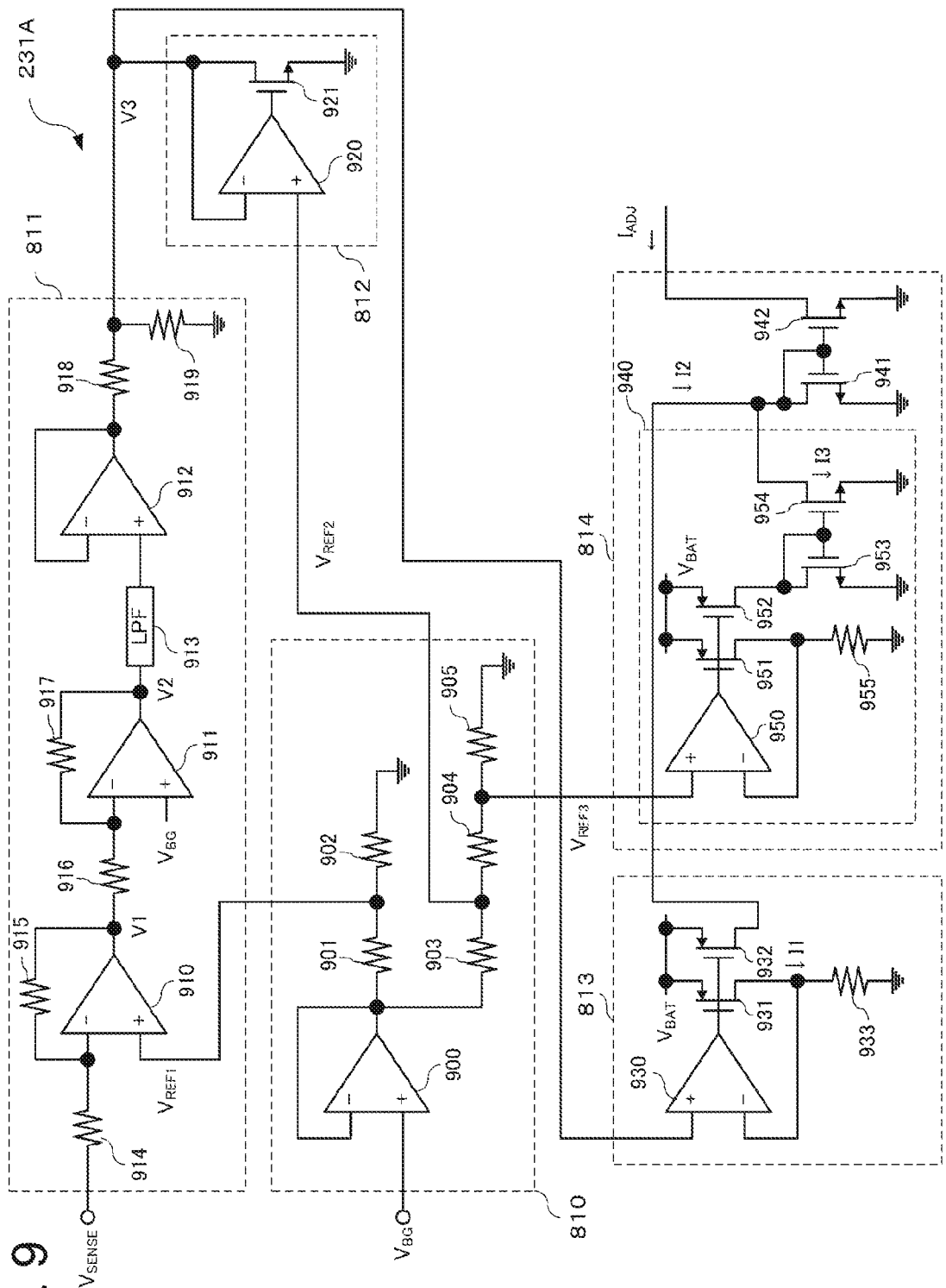
FIG. 9 is a diagram illustrating an example of a configuration of the bias control circuit.

FIG. 9 is a diagram illustrating an example of a configuration of the bias control circuit 231A. The bias control circuit 231A will be described in detail with reference to the FIG. 9.

The reference voltage generator circuit 810 includes the operational amplifier 900 and the resistors 901 to 905. The band gap reference voltage $V_{BG}$ is applied to the non-inverted input terminal of the operational amplifier 900. The inverted input terminal of the operational amplifier 900 is connected to the output terminal. That is, the operational amplifier 900 serves as a voltage follower to output the band gap reference voltage $V_{BG}$ to the output terminal. The resistors 901 and 902 connected to each other in series are connected to the output terminal of the operational amplifier 900. The reference voltage $V_{REF1}$ is output from the connection point of the resistors 901 and 902. The resistors 903 to 905 connected to one another in series are connected to the output terminal of the operational amplifier 900. A reference voltage $V_{REF2}$ is output from the connection point of the resistors 903 and 904. The reference voltage $V_{REF3}$ is output from the connection point of the resistors 904 and 905.

The control voltage generator circuit 811 includes the operational amplifiers 910 to 912, a low pass filter (LPF) 913, and resistors 914 to 919.

The reference voltage $V_{REF1}$ is applied to the non-inverted input terminal of the operational amplifier 910. The detection voltage $V_{SENSE}$ is supplied to the inverted input terminal of the operational amplifier 910 via the resistor 914. The resistor 915 is disposed between the inverted input terminal of the operational amplifier 910 and the output terminal of operational amplifier 910. The operational amplifier 910 and the resistors 914 and 915 constitute the inverting amplifier circuit. Accordingly, the voltage $V_1$ output from the output terminal of the operational amplifier 910 is at a level at which the detection voltage $V_{SENSE}$ is inversely amplified.

The band gap reference voltage $V_{BG}$ is applied to the non-inverted input terminal of an operational amplifier 911. The voltage $V_1$ is supplied to the inverted input terminal of the operational amplifier 911 via the resistor 916. The resistor 917 is disposed between the inverted input terminal of the operational amplifier 911 and the output terminal of operational amplifier 911. The operational amplifier 911 and the resistors 916 and 917 constitute the inverting amplifier circuit. Accordingly, the voltage $V_2$ output from the output terminal of the operational amplifier 911 is at a level at which the voltage $V_1$ is inversely amplified. That is, the voltage $V_2$ output from the output terminal of the operational amplifier 911 is at a level at which the detection voltage $V_{SENSE}$ is amplified.

The voltage $V_2$ is supplied to the non-inverted input terminal of the operational amplifier 912 via the LPF 913. The inverted input terminal of the operational amplifier 912 is connected to the output terminal of the operational amplifier 912. That is, the operational amplifier 912 serves as a voltage follower.

Resistors 918 and 919 constitute the voltage division circuit. The resistors 918 and 919 output the voltage $V_3$ obtained by dividing the voltage output from the output terminal of the operational amplifier 912 based on the resistance ratio of the resistors 918 and 919.

The clamp circuit 812 includes an operational amplifier 920 and an N-channel MOSFET 921. The reference voltage $V_{REF2}$ is applied to the non-inverted input terminal of the operational amplifier 920. The inverted input terminal of the operational amplifier 920 is connected to the drain of the N-channel MOSFET 921. The output terminal of the operational amplifier 920 is connected to the gate of the N-channel MOSFET 921. In the N-channel MOSFET 921, the drain is connected to the output line of the voltage $V_3$ and the source is grounded. In this configuration, the clamp circuit 812 clamps the voltage $V_3$ to be equal to or less than the reference voltage $V_{REF2}$.

The control current generator circuit 813 includes an operational amplifier 930, P-channel MOSFETs 931 and 932, and a resistor 933. The voltage $V_3$ clamped by the clamp circuit 812 is applied to the non-inverted input terminal of the operational amplifier 930. The inverted input terminal of the operational amplifier 930 is connected to one end of the resistor 933. The battery voltage $V_{BAT}$ is applied to the source of the P-channel MOSFET 931. The drain of the P-channel MOSFET 931 is connected to one end of the resistor 933. One end of the resistor 933 is connected to the inverted input terminal of the operational amplifier 930 and the drain of the P-channel MOSFET 931, and the other end thereof is grounded. Accordingly, a current $I_1$ corresponding to the voltage $V_3$ flows in the P-channel MOSFET 931. The P-channel MOSFET 932 is connected to the P-channel MOSFET 931 in a current mirror manner. Accordingly, a current $I_2$ (control current) corresponding to the voltage $V_3$ flows in the P-channel MOSFET 932.

The bias-reducing circuit 814 includes a constant current circuit 940, N-channel MOSFETs 941 and 942.

The constant current circuit 940 (second constant current circuit) includes an operational amplifier 950, P-channel MOSFETs 951 and 952, N-channel MOSFETs 953 and 954, and the resistor 955. The reference voltage $V_{REF3}$ is applied to the non-inverted input terminal of the operational amplifier 950. The inverted input terminal of the operational amplifier 950 is connected to one end of the resistor 955. The battery voltage $V_{BAT}$ is applied to the source of the P-channel MOSFET 951. The drain of the P-channel MOSFET 951 is connected to the one end of the resistor 955. One end of the resistor 955 is connected to the inverted input terminal of the operational amplifier 950 and the drain of the P-channel MOSFET 951, and the other end thereof is grounded. Accordingly, the constant current corresponding to the reference voltage $V_{REF3}$ flows in the P-channel MOSFET 951. The P-channel MOSFET 952 is connected to the P-channel MOSFET 951 in a current mirror manner. The N-channel MOSFET 953 is diode-connected and connected to the P-channel MOSFET 952 in series. Accordingly, the constant current corresponding to the reference voltage $V_{REF3}$ flows in the N-channel MOSFET 953. The N-channel MOSFET 954 is connected to the N-channel MOSFET 953 in a current mirror manner. Accordingly, a constant current $I_3$ (second constant current) corresponding to the reference voltage $V_{REF3}$ flows in the N-channel MOSFET 954.

The N-channel MOSFET 941 is diode-connected and connected to the P-channel MOSFET 932 of the control current generator circuit 813 in series. The drain of the N-channel MOSFET 941 is connected to the drain of the N-channel MOSFET 954 of the constant current circuit 940. Accordingly, when the current $I_2$ is greater than the constant current $I_3$, a differential current ($I_2-I_3$) flows in the N-channel MOSFET 941. The N-channel MOSFET 942 is connected to the N-channel MOSFET 941 in a current mirror manner. Accordingly, the adjustment current $I_{ADJ}$ corresponding to difference between the current $I_2$ and the constant current $I_3$ flows in the N-channel MOSFET 942.

An example of the operations of the bias control circuit 231A and the bias generator circuit 230A will be described with reference to FIGS. 10A to 10C.

Figure 10A:
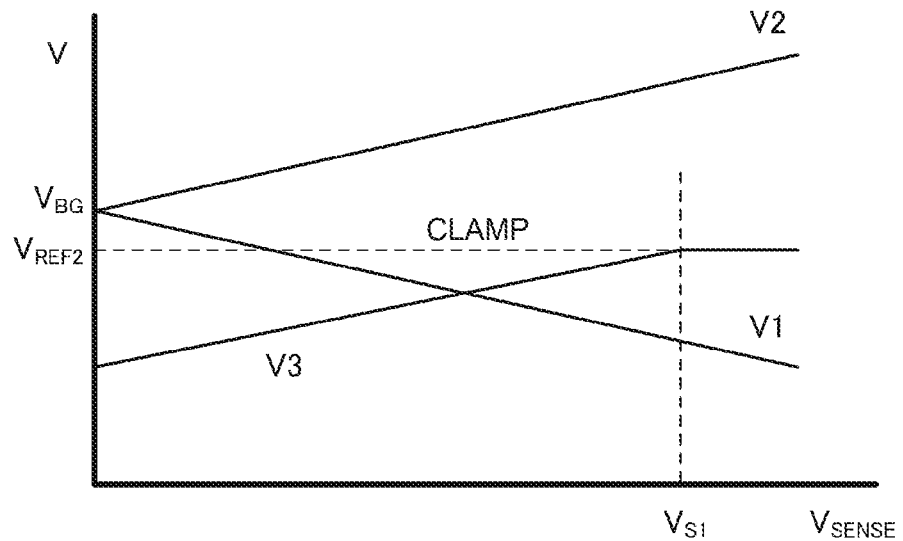
FIG. 10A is a graph illustrating an example of a relation between a detection voltage $V_{SENSE}$ and each of voltages $V_1$, $V_2$, and $V_3$.

FIG. 10A is a graph illustrating an example of a relation between detection voltage $V_{SENSE}$ and each of voltages $V_1$, $V_2$, and $V_3$. In FIG. 10A, the horizontal axis represents a value of the detection voltage $V_{SENSE}$ and the vertical axis represents values of the voltages $V_1$, $V_2$, and $V_3$. As the detection voltage $V_{SENSE}$ increases, the voltage $V_1$ decreases and the voltage $V_2$ increases. Since the voltage $V_3$ is a voltage obtained by dividing voltage $V_2$, the voltage $V_3$ increases as the detection voltage $V_{SENSE}$ increases. However, in a region where the detection voltage $V_{SENSE}$ is equal to or greater than $V_{S1}$, the voltage $V_3$ is clamped to the reference voltage $V_{REF2}$ by the clamp circuit 812.

Figure 10B:
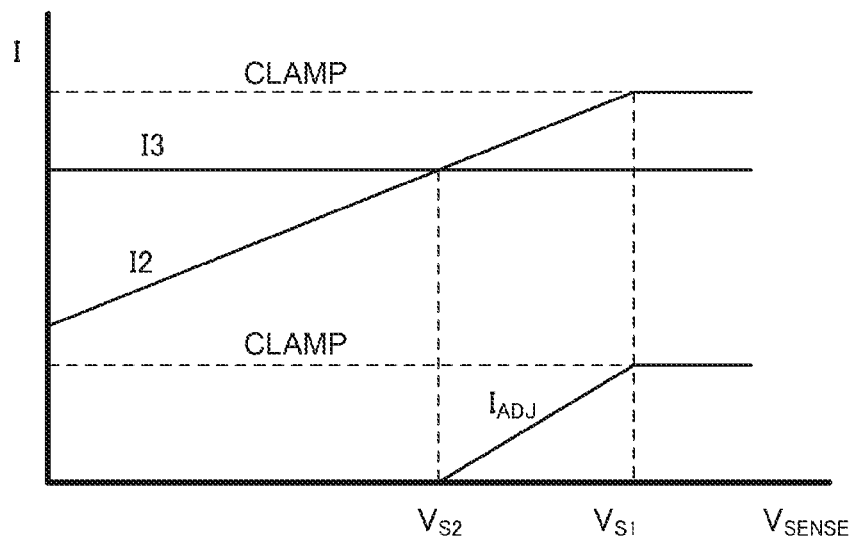
FIG. 10B is a graph illustrating an example of a relation between the detection voltage $V_{SENSE}$ and each of currents $I_2$, $I_3$, and $I_{ADJ}$.

FIG. 10B is a graph illustrating an example of a relation between the detection voltage $V_{SENSE}$ and each of currents $I_2$, $I_3$, and $I_{ADJ}$. In FIG. 10A, the horizontal axis represents the detection voltage $V_{SENSE}$ and the vertical axis represents amounts of currents $I_2$, $I_3$, and $I_{ADJ}$. Since the current $I_2$ is a current corresponding to the voltage $V_3$, the current $I_2$ increases as the detection voltage $V_{SENSE}$ increases. However, the current $I_2$ is also clamped by clamping the voltage $V_3$. The adjustment current $I_{ADJ}$ is generated when the current $I_2$ is greater than the constant current $I_3$ ($V_{SENSE} > V_{S2}$). However, the adjustment current $I_{ADJ}$ is clamped by clamping the current $I_2$.

Figure 10C:
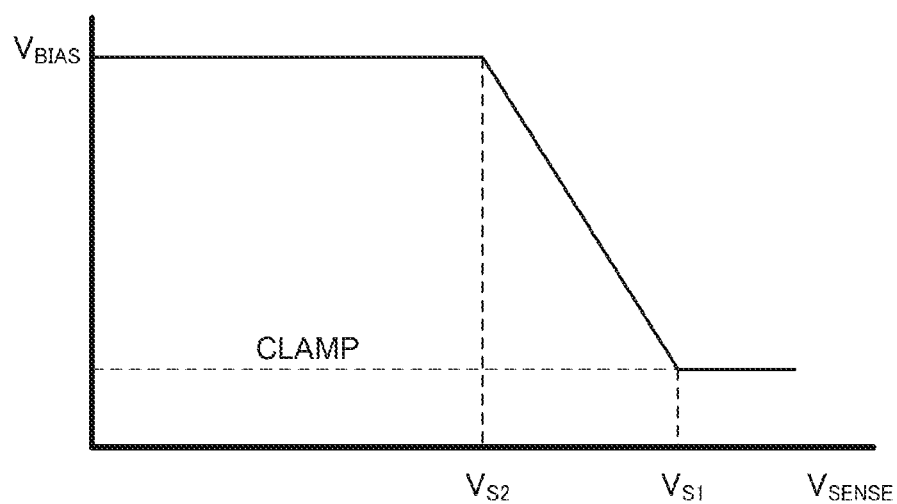
FIG. 10C is a graph illustrating an example of a relation between the detection voltage $V_{SENSE}$ and a bias voltage $V_{BIAS}$.

FIG. 10C is a graph illustrating an example of a relation between the detection voltage $V_{SENSE}$ and the bias voltage $V_{BIAS}$. In FIG. 10C, the horizontal axis represents a value of the detection voltage $V_{SENSE}$ and the vertical axis represents a value of the bias voltage $V_{BIAS}$. As illustrated in FIG. 10B, the adjustment current $I_{ADJ}$ is generated when the current $I_2$ is greater than the constant current $I_3$ ($V_{SENSE} > V_{S2}$). Accordingly, in a region where the detection voltage $V_{SENSE}$ is greater than voltage $V_{S2}$, the bias voltage $V_{BIAS}$ decreases as the detection voltage $V_{SENSE}$ increases. Accordingly, it is possible to limit current $I_C$ flowing in the power amplifier circuit 200A. As illustrated in FIG. 10B, the adjustment current $I_{ADJ}$ is clamped to be equal to less than the predetermined level. Accordingly, the bias voltage $V_{BIAS}$ is clamped to be equal to greater than the predetermined level. According to this embodiment, it is possible to prevent the operation of the NPN transistor 210 of the power amplifier circuit 200A from stopping due to the decrease in the bias voltage $V_{BIAS}$.

As illustrated in FIG. 10C, a lower limit of the bias voltage $V_{BIAS}$ can be adjusted based on the level at which the voltage $V_3$ is clamped, that is, the reference voltage $V_{REF2}$. Accordingly, for example, the lower limit of the bias voltage $V_{BIAS}$ can be adjusted based on the resistance values of the resistors 903 to 905. As illustrated in FIG. 10C, a slope of a region in which the bias voltage $V_{BIAS}$ decreases is adjusted based on the size ratio of the N-channel MOSFETs 941 and 942.

This embodiment is intended for easy understanding of the present invention and is not intended for limiting the present invention. The present invention can be modified/improved without departing from the gist thereof and includes equivalents thereof.

DESCRIPTION OF REFERENCE NUMERALS 100 transmission unit
101 modulation unit
102 transmission power control unit
103A, 103B power amplifier module
104 front end unit
105 antenna
200, 200A power amplifier circuit
201, 201A control circuit
202, 212 matching network
210, 211 NPN transistor
213, 214 capacitor
215 to 219, 302, 303, 400, 500, 501, 801, 901 to 905, 914 to 919, 933, 955 resistor
230, 230A bias generator circuit
231, 231A bias control circuit
300 band gap circuit
301, 900, 910 to 912, 920, 930 operational amplifier
310, 800 constant current circuit
311 low-pass filter
312 comparator
313, 502, 503, 931, 932, 951, 952 P-channel MOSFET 410, 920, 941, 942, 953, 954 N-channel MOSFET
810 reference voltage generator circuit
811 control voltage generator circuit
812 clamp circuit
813 control current generator circuit
814 bias-reducing circuit

What is claimed is:

1. A power amplifier module comprising:
a first amplification transistor configured to amplify and output a radio frequency signal;
a second amplification transistor connected in parallel to the first amplification transistor and having a smaller size than the first amplification transistor;
a bias circuit configured to supply a bias voltage or a bias current to the first and second amplification transistors;
a current detector circuit configured to detect a current flowing in the second amplification transistor;
a bias control circuit configured to control the bias voltage or the bias current supplied from the bias circuit to the first and second amplification transistors depending on the detection result of the current detector circuit; and
a reference voltage generator circuit configured to generate a predetermined reference voltage,
wherein the current detector circuit includes a detection resistor connected in series to the second amplification transistor, the detection resistor being configured to generate a detection voltage corresponding to the current flowing in the second amplification transistor, and
wherein the bias control circuit includes a comparator circuit configured to compare the detection voltage with the reference voltage, and a first bias-reducing circuit configured to reduce the bias voltage or the bias current when the detection voltage is greater than the predetermined reference voltage on the basis of the comparison result of the comparator circuit.

2. The power amplifier module according to claim 1, wherein a number of fingers of the second amplification transistor is smaller than a number of fingers of the first amplification transistor.

3. The power amplifier module according to claim 2, wherein the fingers of the first and second amplification transistors have a same emitter size.

4. The power amplifier module according to claim 1, wherein the bias circuit includes a bias adjusting circuit configured to supply the bias current corresponding to a ratio of a size of the first and second amplification transistors to a size of the first and second amplification transistors.

5. The power amplifier module according to claim 1, further comprising:
a first capacitor disposed in a supply path of the radio frequency signal to the first amplification transistor;
a second capacitor disposed in a supply path of the radio frequency signal to the second amplification transistor and having a capacitance value smaller than that of the first capacitor, the capacitance value of the second capacitor being based on a ratio of a size of the first amplification transistor to a size of the second amplification transistor.

6. The power amplifier module according to claim 1, further comprising a reference current generator circuit configured to generate a predetermined reference current,
wherein the reference voltage generator circuit includes a reference resistor formed on a same chip as the detection resistor and configured to generate the reference voltage on the basis of the reference current.

7. The power amplifier module according to claim 1, wherein the bias circuit includes a non-inverting amplifier circuit configured to generate a bias voltage corresponding to an input voltage, and
wherein the first bias-reducing circuit is configured to control the non-inverting amplifier circuit so as to reduce the bias voltage when the detection voltage is greater than the predetermined reference voltage.

8. The power amplifier module according to claim 7, wherein the non-inverting amplifier circuit includes an operational amplifier having an output terminal configured to output the bias voltage, a non-inverted input terminal supplied with the input voltage, and an inverted input terminal connected to the output terminal via a first resistor and grounded via a second resistor, and
wherein the first bias-reducing circuit includes a current circuit configured to cause a current to flow in the inverted input terminal of the non-inverting amplifier circuit when the detection voltage is greater than the predetermined reference voltage.

9. The power amplifier module according to claim 7, wherein the non-inverting amplifier circuit includes an operational amplifier having an output terminal configured to output the bias voltage, an inverted input terminal connected to the output terminal via a first resistor and grounded via a second resistor, and a non-inverted input terminal configured to be supplied with the input voltage via a third resistor, and
wherein the first bias-reducing circuit includes a current circuit configured to cause a current to flow from between the third resistor and the non-inverted input terminal of the non-inverting amplifier circuit to the ground when the detection voltage is greater than the predetermined reference voltage.

10. The power amplifier module according to claim 1, wherein the bias circuit includes a current generator circuit configured to generate a bias current corresponding to the input voltage, and
wherein the bias-reducing circuit is configured to control the current generator circuit so as to reduce the bias current when the detection voltage is greater than the predetermined reference voltage.

11. The power amplifier module according to claim 10, wherein the current generator circuit is configured to be supplied with the input voltage via a fourth resistor, and
wherein the bias-reducing circuit includes a current circuit configured to decrease the input voltage supplied to the current generator circuit by causing a current to flow from between the fourth resistor and the current generator circuit to the ground when the detection voltage is greater than the predetermined reference voltage.

12. The power amplifier module according to claim 10, wherein the bias-reducing circuit includes a current circuit configured to cause a part of the bias current to flow to the ground when the detection voltage is greater than the predetermined reference voltage.

13. The power amplifier module according to claim 1, wherein the bias control circuit includes
a control voltage generator circuit configured to generate a control voltage corresponding to the detection voltage,
a clamp circuit configured to clamp the control voltage to be equal to or less than the predetermined reference voltage,
a control current generator circuit configured to generate a control current corresponding to the control voltage clamped by the clamp circuit, and
a second bias-reducing circuit configured to reduce the bias voltage based on the control current.

14. The power amplifier module according to claim 13, wherein the bias circuit includes
a first constant current circuit configured to output a first constant current,
a fifth resistor connected to the first constant current circuit in series, and
an amplifier circuit configured to amplify a voltage at one end of the fifth resistor so as to output the amplified voltage, and
wherein a second bias-reducing circuit controls an amount of current which is input from the first constant current circuit to the fifth resistor based on the control current.

15. The power amplifier module according to claim 14, wherein the second bias-reducing circuit includes a second constant current circuit configured to output a second constant current, and
wherein when the control current is greater than the second constant current, and a current corresponding to the difference between the second constant current and the control current is extracted from between the first constant current circuit and the fifth resistor.

16. A power amplifier module comprising:
a first amplification transistor configured to amplify and output a radio frequency signal;
a second amplification transistor connected in parallel to the first amplification transistor and having a smaller size than the first amplification transistor;
a bias circuit configured to supply a bias voltage or a bias current to the first and second amplification transistors;
a current detector circuit configured to detect a current flowing in the second amplification transistor;
a bias control circuit configured to control the bias voltage or the bias current supplied from the bias circuit to the first and second amplification transistors depending on the detection result of the current detector circuit;
a first capacitor disposed in a supply path of the radio frequency signal to the first amplification transistor; and
a second capacitor disposed in a supply path of the radio frequency signal to the second amplification transistor and having a capacitance value smaller than that of the first capacitor, the capacitance value of the second capacitor being based on a ratio of a size of the first amplification transistor to a size of the second amplification transistor,
wherein the current detector circuit includes a detection resistor connected in series to the second amplification transistor, the detection resistor being configured to generate a detection voltage corresponding to the current flowing in the second amplification transistor, and
wherein the bias control circuit includes
a control voltage generator circuit configured to generate a control voltage corresponding to the detection voltage,
a clamp circuit configured to clamp the control voltage to be equal to or less than the predetermined reference voltage,
a control current generator circuit configured to generate a control current corresponding to the control voltage clamped by the clamp circuit, and
a second bias-reducing circuit configured to reduce the bias voltage based on the control current.

17. The power amplifier module according to claim 16, wherein the bias circuit includes
a first constant current circuit configured to output a first constant current,
a fifth resistor connected to the first constant current circuit in series, and
an amplifier circuit configured to amplify a voltage at one end of the fifth resistor so as to output the amplified voltage, and
wherein a second bias-reducing circuit controls an amount of current which is input from the first constant current circuit to the fifth resistor based on the control current.

18. The power amplifier module according to claim 17, wherein the second bias-reducing circuit includes a second constant current circuit configured to output a second constant current, and
wherein when the control current is greater than the second constant current, and a current corresponding to the difference between the second constant current and the control current is extracted from between the first constant current circuit and the fifth resistor.

* * * * *